United States Patent [19]
Mobley

[11] Patent Number: 6,055,192
[45] Date of Patent: Apr. 25, 2000

[54] DYNAMIC RANDOM ACCESS MEMORY WORD LINE BOOST TECHNIQUE EMPLOYING A BOOST-ON-WRITES POLICY

[75] Inventor: Kenneth J. Mobley, Colorado Springs, Colo.

[73] Assignee: Enhanced Memory Systems, Inc., Colorado Springs, Colo.

[21] Appl. No.: 09/146,726

[22] Filed: Sep. 3, 1998

[51] Int. Cl.[7] ........................ G11C 7/00
[52] U.S. Cl. .............. 365/189.11; 365/203; 365/230.06
[58] Field of Search .............. 365/189.11, 203, 365/230.06

[56] References Cited

U.S. PATENT DOCUMENTS

| | | | |
|---|---|---|---|
| 5,455,789 | 10/1995 | Nakamura et al. | 365/189.11 |
| 5,550,775 | 8/1996 | Abe et al. | 365/189.11 |
| 5,673,225 | 9/1997 | Jeong et al. | 365/189.11 |
| 5,841,706 | 11/1998 | Umezaki et al. | 365/189.11 |
| 5,864,508 | 1/1999 | Takashima et al. | 365/189.11 |

*Primary Examiner*—Son T. Dinh
*Attorney, Agent, or Firm*—William J. Kubida, Esq.; Holland & Hart LLP

[57] ABSTRACT

A word line boost-on-writes technique for a dynamic random access memory device in which the word lines are initially boosted upon opening of a page in the memory array and then again following each write command, or following a predetermined number of write cycles in the case of a burst write, in order that the precharge cycle can proceed without delay due to the boost operation. Each boost is applied for a limited duration so that the overall precharge time is not affected.

24 Claims, 2 Drawing Sheets

DYNAMIC RANDOM ACCESS MEMORY WORD LINE BOOST TECHNIQUE EMPLOYING A BOOST-ON-WRITES POLICY

BACKGROUND OF THE INVENTION

The present invention relates, in general, to the field of integrated circuit ("IC") dynamic random access memory ("DRAM") devices. More particularly, the present invention relates to the operational control of DRAM devices utilizing a "boost-on-writes" technique which obviates the need to boost the word line on entry into precharge thereby reducing total precharge time and increasing overall device access time.

Conventional DRAM devices are designed utilizing a volatile, dynamic memory cell memory array architecture, with each cell generally comprising a single transistor and capacitor. Such cells are "volatile" in the sense that upon powerdown, the memory contents is lost and "dynamic" in the sense that they must be constantly refreshed to maintain the charge in the cell capacitor. The refresh operation is accomplished when the memory contents of a row of cells in the memory array is read by the sense amplifiers and the logic states in the cells that have been read are amplified and written back to the cells. DRAM devices are used primarily for memory reads and writes and are relatively inexpensive to produce in terms of die area. They do, however, provide relatively slow access times compared to other memory devices types and refresh, precharge and other DRAM related "overhead" operations must be completed as expeditiously as possible in order to provide acceptable data access times in modern which speed applications.

With respect to precharge operations in a typical DRAM device, the word lines are generally "boosted" above the power supply level (in the case of an N-channel transistor based memory array; or below in the case of a P-channel memory array) to improve the strength of the internal one (or zero) signal. In a representative DRAM design, a P-channel transistor based array is used and the word lines are driven low using an associated N-channel device which is formed in the grounded IC substrate. However, the use of a below circuit ground boost has the undesired effect of causing a forward bias condition to exist on the parasitic diodes of these N-channel devices, thereby limiting both the voltage and duration of the boost. As a consequence, in order to insure that all bits are written fully, prior art techniques have required that the word line be boosted upon each entry into a precharge operation, thereby delaying the duration of the precharge function by the time needed for the additional boost period and effectively decreasing overall device access time.

SUMMARY OF THE INVENTION

To avoid this delay, the present invention advantageously discloses a technique to boost the word lines initially upon opening a page in the memory array and then again following each write command, (or following a predetermined number of write cycles in the case of a burst write) in order that the precharge cycle can proceed without delay due to a word line boost, unlike previously implemented techniques. Each boost is applied for a limited duration so that the precharge time is not affected.

Particularly disclosed herein is a method for operatively controlling a dynamic random access memory device incorporating a memory array comprising rows and columns of memory cells, wherein each of the memory cells includes a P-channel access transistor and associated capacitor and the memory device further comprises first and second supply voltage sources. A first terminal of the access transistor is coupled to a bit line selectively couplable to either of the first and second supply voltage sources and a second terminal of the access transistor is coupled to one terminal of the associated capacitor. The associated capacitor has an opposite terminal thereof coupled to the first supply voltage source and the access transistor further has a control terminal coupled to a word line which is also selectively couplable to either of the first and second supply voltage sources. The method comprises the operations of: coupling the bit line to the second supply voltage source to precharge the bit line; subsequently coupling the word line to the first supply voltage source to read a state of the associated capacitor; boosting the word line below a level of the first supply voltage source for a limited duration to restore the state of the associated capacitor; and additionally re-boosting the word line below the level of the first supply voltage source prior to, during, or following each write operation to the memory cell.

Further disclosed herein is a method for boosting a word line in a random access memory device incorporating an N-channel memory array. The method comprises the operations of: coupling a bit line to a low supply voltage source to precharge the bit line; subsequently coupling an associated word line to a high supply voltage to read a state of a memory cell coupled between the bit line and the word line; boosting the word line above a level of the high supply to restore the state of the memory cell; and additionally boosting the word line above the level of the high supply prior to, during, or immediately following, each write operation to the memory cell.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
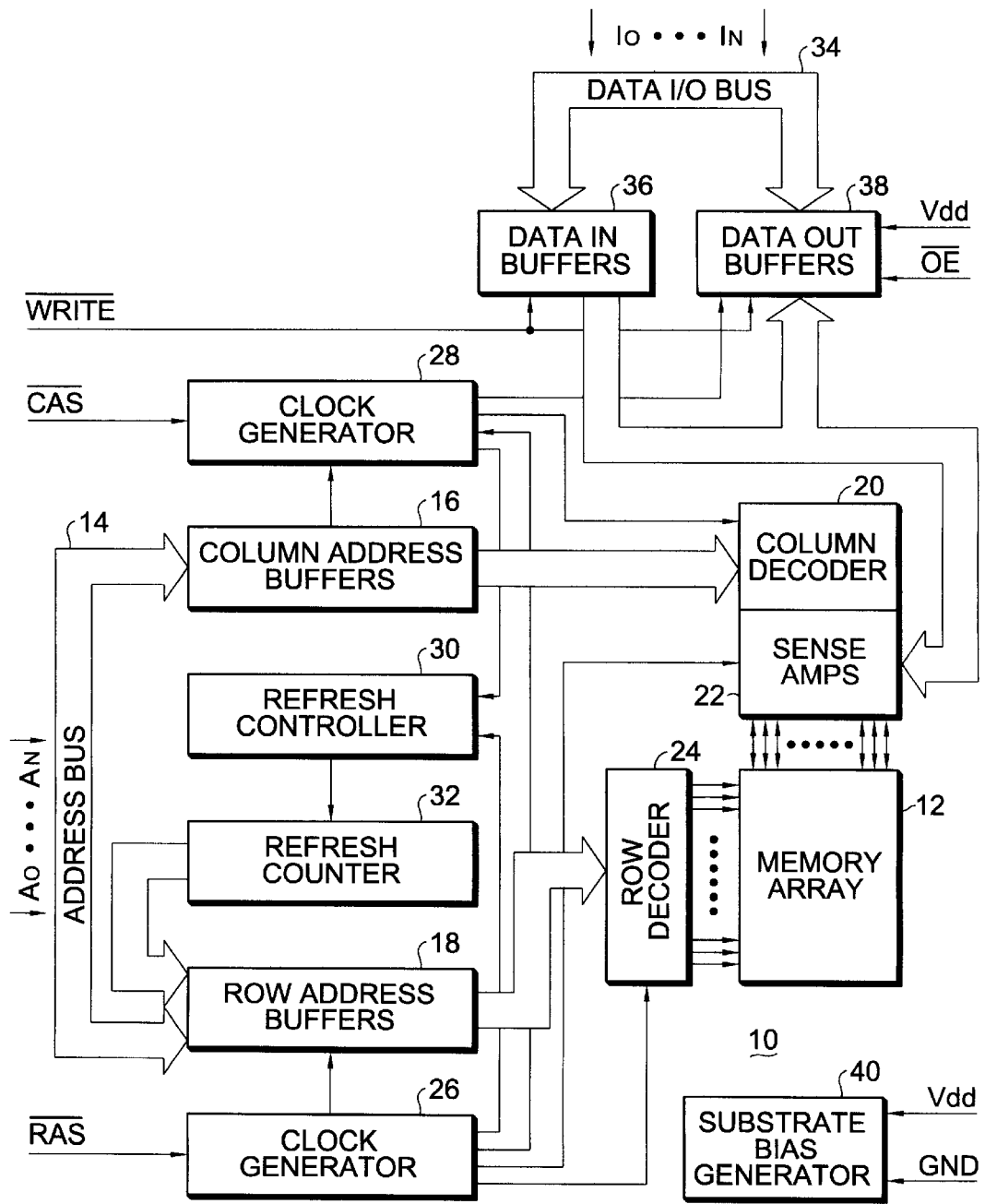
FIG. 1 is a functional block diagram of a representative integrated circuit dynamic random access memory ("DRAM") device for possible utilization of the word line boost-on-writes technique of the present invention.

With reference now to FIG. 1, a representative integrated circuit ("IC") dynamic random access memory ("DRAM") memory device 10 is shown for possible implementation of the boost-on-writes polLicy of the present invention. The memory device 10 is here shown to be an asynchronous DRAM. A synchronous DRAM could alternately be shown and operation of an embodiment of the present invention could alternately be described with respect to a DRAM. The memory device 10 comprises a memory array 12 including a plurality of individual memory cells (as will be more fully described hereinafter) arranged in rows and columns for retention of data in the form of logic level "1s" and "0s".

Access to selected memory cells within the memory array 12 is afforded by means of an external address bus 14 having a plurality of address lines $A_0$ through $A_N$ inclusive dependent upon the physical size of the memory array 12. The address bus 14 is coupled to provide column addresses to a number of column address buffers 16 as well as row addresses to a number of row address buffers 18. The column address buffers 16 store column addresses for input to a column decoder 20 and associated sense amplifiers 22 to access selected columns in the memory array 12. Similarly, the row address buffers store row addresses for input to a row decoder 24 to access selected rows in the memory array 12.

A clock generator 26 is coupled to receive a row address strobe ("/RAS") signal and supply clocking signals to the row decoder 24 and sense amplifiers 22 as well as an output signal to the row address buffers 18. An additional clock generator 28 receives a column address strobe ("/CAS") signal as well as an output signal from the clock generator 26 and the column address buffers 28. The clock generator supplies an output signal to the column decoder 20 as well as a refresh controller 30 which also receives an output from the clock generator 26. The refresh controller 30 operatively controls a refresh counter 32 which is coupled to the row address buffers 18.

Data written to, or read from the memory array 12 is applied to a data input/output ("I/O") bus 34 having a number of bi-directional pins thereof denominated $I_0$ through $I_N$ inclusive. Data to be written to the memory array 12 is stored in a number of data in buffers 36 while data read out from the memory array is stored in number of data our buffers 38. The operation of the memory device 10 is controlled by a /WRITE signal applied to the data in buffers 36 and data out buffers 38, the latter also receiving an output of the clock generator 28. The data out buffers 38 also receive an output enable ("/OE") signal to cause them to supply the data then currently retained onto the data I/O bus 34. As shown, the memory device 10 may further include an onchip substrate bias generator 40 having $V_{DD}$ and $V_{SS}$ supply voltage inputs thereto.

Figure 2A:
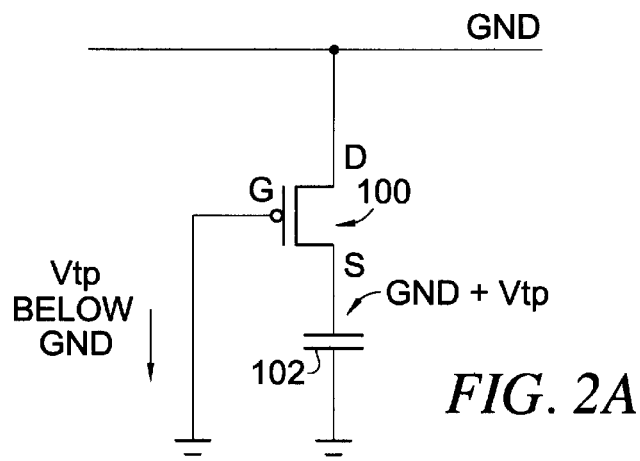
FIG. 2A is a schematic illustration of a typical P-channel transistor having its drain terminal coupled to circuit ground ("Gnd"), its source terminal coupled to an associated capacitor having its opposite terminal coupled to ground and a gate terminal being capable of being pulled to Gnd and a threshold voltage ("Vtp") below Gnd.

With reference now to FIG. 2A, a P-channel transistor 100 is shown having a capacitor 102 coupling its source terminal to circuit ground ("Gnd"). The simplified circuit shown is useful in understanding the principles of the present invention. The drain terminal of transistor 100 is coupled directly to Gnd while the gate terminal is capable of being pulled to a level below Gnd in order to allow the source terminal to reach ground potential.

As background information, all MOS (metal oxide semiconductor) transistors exhibit an inherent threshold voltage ("Vt"). Therefore, if it is desired to pull a given circuit node "high", (such as that node coupling the transistor 100 and capacitor 102) in the case of an N-channel device having a threshold voltage "Vtn", the gate of the transistor must be pulled up to a level of $V_{DD}$+Vtn to obtain a level of $V_{DD}$ at the circuit node. Alternatively, to pull the same node "low" through a P-channel device having a threshold voltage "Vtp" such as transistor 100 shown in FIG. 2A, the gate must be pulled down to a level of Gnd−Vtp to obtain a level of Gnd at the circuit node. If the gate terminal were only pulled to Gnd, the source terminal would actually only achieve a voltage level of circuit ground ("Gnd") plus Vtp due to the transistor threshold voltage.

Figure 2B:
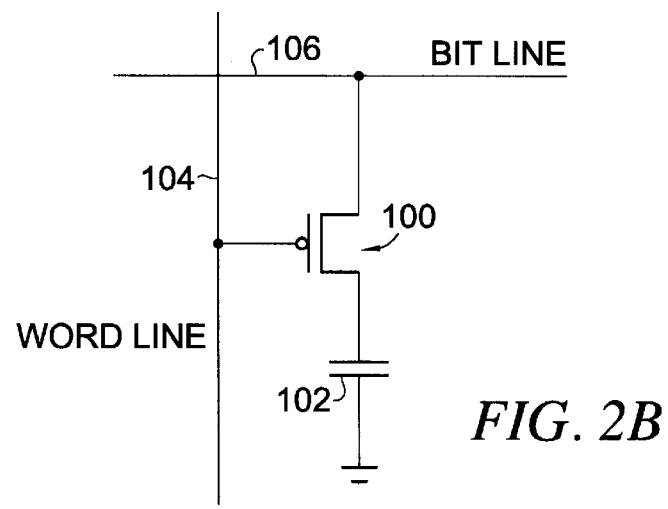
FIG. 2B is a corresponding schematic illustration of a conventional DRAM single transistor/single capacitor ("1T/1C") memory cell similar to the configuration of FIG. 2A for use, for example, in the memory array of FIG. 1, illustrating the coupling of the access transistor drain and gate terminals to adjacent bit and word lines respectively.

With additional reference now to FIG. 2B, a typical DRAM memory cell is shown. The DRAM memory cell comprises an access transistor 100 (for purposes of example only, a P-channel transistor) coupled in series with a capacitor 102 between an associated bit line (or bit\line) 106 and another voltage line at Gnd potential (or "$V_{SS}$") The capacitor 102 holds a charge (or the absence of a charge) representative of one of two opposite logic states (a "one" or "zero") which is read out by activating the transistor 100 through the application of an appropriate signal on the word line 104, thus either adding charge to, or removing charge from, the bit line 106. A sense amplifier (not shown) is coupled between the bit (and bit\) line 106.

Because the charge in the capacitor 102 tends to bleed off over time, it must be periodically recharged, or refreshed. Refresh is accomplished when the memory contents of a row of memory cells is read by the associated sense amplifiers and the logic states that were read are amplified and then written back to the memory cells.

In a DRAM memory array 12, word lines 104 are typically "boosted" above (or below for P-channel transistor arrays) the power supply level to improve the strength of the internal one (or zero) signal. As mentioned previously, in at least one conventional DRAM design, a P-channel array is used and the word lines are driven low using an N-channel device which is fabricated in a grounded substrate. The use of a below-ground boost unfortunately causes a forward bias condition to exist on the parasitic diodes of said N-channel device, thereby limiting both the voltage and duration of the boost. To then insure that all bits are written fully, the word lines must be "boosted" upon entry into each precharge operation, thereby delaying the overall precharge time by the duration of the boost period.

In order to obviate the delay incurred due to the "boost" preceding each precharge operation, the present invention is operational to boost the word lines initially upon opening a page in the memory array 12 and then again following each write command (or following a predetermined number of write cycles in the case of a burst write) in order that the precharge cycle can proceed without delay. Each boost may be applied for a limited duration in order that the overall precharge time is not affected.

As shown, the word line 104 is coupled to the transistor 100 gate terminal; the bit line 106 is coupled to the drain terminal and the source terminal is coupled to circuit ground through an associated memory cell capacitor 102. In the case of a P-channel memory array, in order to write as low a level into the cell as possible (assuming a logic "low" state), it is then necessary to drive the word line 104 (coupled to the transistor gate) below ground by at least a Vtp.

Operationally, a determination must be made as to when is the most advantageous time to take the word line 104 to Gnd-Vtp. If the bit lines 106 are precharged to a "high" state when they are idle, and the word line 104 is brought to ground in order to read the state out of the DRAM cell, then because the associated bit line 106 is "high", the transistor 100 terminal coupled to it essentially becomes the source so that the state of the cell can be easily read out without needing to boost the word line. However, in order to ensure that the state is properly written back into the cell during a refresh or write operation, boosting the word line 104 becomes important.

As a consequence, certain conventional techniques allow the word line 104 to remain at circuit ground, while the cell is read and the bit lines 106 are charged to the appropriate levels based on the data in the cell. At this point, the voltage at the transistor 100 source is now at a level somewhat greater than ground and it remains in that state until it is again time to precharge the bit lines 106 and restore the array back to the idle state. Then at that point in time, a command is issued to precharge everything and the word line 104 (currently at ground potential) must then be boosted "low" for a period of time before it can be again brought "high" to allow for the precharge of the bit lines. So from the time the command to precharge has been issued, a word line 104 boost delay is built into the overall precharge time which serves to then prolong each precharge operation. An earlier implemented alternative technique is, upon access of the word line 104, to then drive it below ground and to maintain it at that level for the entire time that the memory array is active.

Among the problems inherent in the former technique is that if the memory array is formed in a well on the IC substrate and the device driving the word line is not in the same well, the device not in the well will exhibit a fixed back bias when the substrate is tied to a power supply voltage level. In the case of an N-channel device, it is, by its very nature one which has its substrate tied to ground. Therefore, any node which is coupled to an N-channel device, if the node goes substantially below ground, begins to form a parasitic diode inherent to that device. So in order to boost the gate of transistor 100 below ground and have it remain low with no leakage for a long period of time, the implication is that it should not be coupled to an N-channel device. This then implies the need for a P-Channel bootstrap driver of one sort or another to drive the gate of transistor 100. Bootstrap drivers are, unfortunately very problematic because they have floating nodes that are undriven during the period of time that the gate is boosted.

Figure 3:
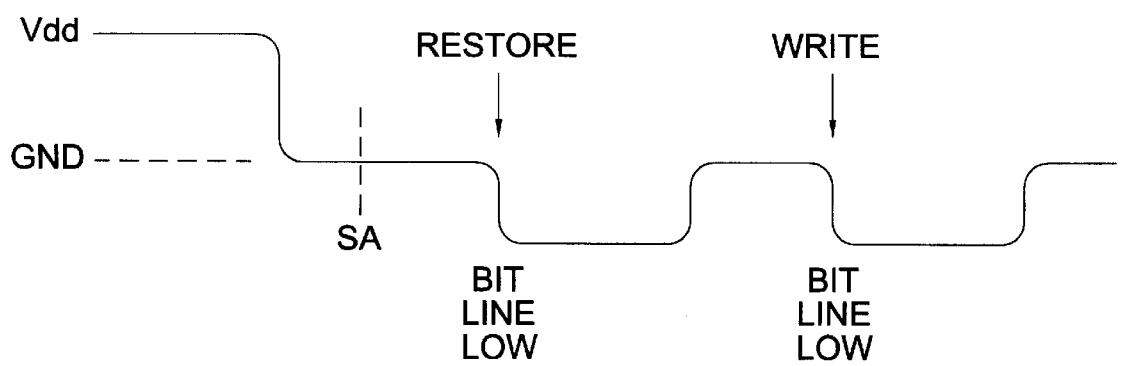
FIG. 3 is a simplified representative wave form of the voltage level on the word line of FIG. 2B illustrative of the boost-on-writes technique of the present invention.

With reference additionally now to FIG. 3, a representative waveform of the voltage levels on the word line 104 of the preceding figure is shown illustrative of the boost-on-writes technique of the present invention.

In operation, when a write operation is to be performed, the word line 104 is brought from a level of $V_{DD}$ to Gnd, following which the sense amplifiers 22 are activated at the time "SA" indicated. Thereafter, as soon as the bit line 106 has reached Gnd, the word line 104 is then immediately brought below Gnd for a predetermined period of time before normal precharge operations are undertaken ("Restore"). This serves to restore the values in the memory cells. However, in the event of a subsequent write operation to a particular cell, the cell would not have been restored to its full value as the state of the cell changes and the below Gnd boost would not have been of benefit. To compensate for this situation, the below ground boost is then undertaken on each write cycle ("Write"). Although this potentially serves to require an additional overhead operation on writes, since the duration of the boost is relatively short, driver related concerns are not significant. Moreover, the duration of a conventional precharge operation has now been reduced by eliminating the boost operation during that phase.

While there have been described above the principles of the present invention in conjunction with a specific DRAM memory device and P-channel transistor memory arrays, it is to be clearly understood that the foregoing description is made only by way of example and not as a limitation to the scope of the invention which is similarly applicable to all DRAM devices, including those utilizing N-channel transistor memory arrays. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for operatively controlling a dynamic random access memory device incorporating a memory array comprising rows and columns of memory cells, each of said memory cells including an access transistor and associated capacitor, a first terminal of said access transistor being coupled to a bit line selectively couplable to either of first and second supply voltage sources and a second terminal of said access transistor being coupled to one terminal of said associated capacitor, said associated capacitor having an opposite terminal thereof coupled to a fixed voltage source, said access transistor further having a control terminal coupled to a word line, said method comprising:

causing said bit line to approach a bit-line precharge voltage to precharge said bit line;

subsequently coupling said word line to a read-state voltage source to read a state of said associated capacitor;

boosting said word line beyond a level of said read-state voltage source to restore said state of said associated capacitor; and additionally boosting said word line beyond said level of said read-state voltage source prior to, during, or following, each write operation or group of write operations to said memory cell.

2. The method of claim 1 wherein said operation of coupling is carried out by the operation of maintaining said bit line at a level of said bit-line precharge voltage while said memory device is in an idle state thereof.

3. The method of claim 1 wherein said operation of subsequently coupling comprises subsequently coupling said word line to said first supply voltage source.

4. The method of claim 1 wherein said operation of boosting is carried out by the operation of driving said word line at least a threshold voltage level of said access transistor beyond said level of said read-state voltage source.

5. The method of claim 1 wherein said operation of additionally boosting is carried out by the operation of driving said word line at least a threshold voltage level of said access transistor beyond said level of said read-state voltage source.

6. A method for operatively controlling a dynamic random access memory device incorporating a memory array comprising rows and columns of memory cells, each of said memory cells including an access transistor and associated capacitor, a first terminal of said access transistor being coupled to a bit line selectively couplable to either of first and second supply voltage sources and a second terminal of said access transistor being coupled to one terminal of said associated capacitor, said associated capacitor having an opposite terminal thereof coupled to a fixed voltage source, said access transistor further having a control terminal coupled to a word line, said method comprising:

causing said bit line to approach a bit line precharge voltage to precharge said bit line;

subsequently coupling said word line to a read-state voltage source to read a state of said associated capacitor;

boosting said word line below a level of said read-state voltage source to restore said state of said associated capacitor; and additionally boosting said word line below said level of said read-state supply voltage source prior to, during, or following, each write operation or group of write operations to said memory cell.

7. The method of claim 6 wherein said operation of coupling is carried out by the operation of maintaining said bit line at a level of said bit line precharge voltage while said memory device is in an idle state thereof.

8. The method of claim 6 wherein said operation of subsequently coupling comprises subsequently coupling said word line to said first supply voltage source.

9. The method of claim 6 wherein said operation of boosting is carried out by the operation of driving said word line at least a threshold voltage level of said access transistor below said level of said read-state voltage source.

10. The method of claim 6 wherein said operation of additionally boosting is carried out by the operation of driving said word line at least a threshold voltage level of said access transistor below said level of said read-state voltage source.

11. A method for operatively controlling a dynamic random access memory device incorporating a memory array comprising rows and columns of memory cells, each of said memory cells including an access transistor and associated capacitor, said memory device further comprising first and second supply voltage sources, a first terminal of said access transistor being coupled to a bit line and a second terminal of said access transistor being coupled to one terminal of said associated capacitor, said associated capacitor having an opposite terminal thereof coupled to a fixed voltage source, said access transistor further having a control terminal coupled to a word line, said method comprising:

causing said bit line to approach a bit-line precharge voltage to precharge said bit line;

subsequently coupling said word line to a read-state voltage source to read a state of said associated capacitor;

boosting said word line above a level of said read-state voltage source to restore said state of said associated capacitor; and additionally boosting said word line above said level of said read-state voltage source prior to, during, or following, each write operation or group of write operations to said memory cell.

12. The method of claim 11 wherein said operation of coupling is carried out by the operation of maintaining said bit line at a level of the bit-line precharge voltage while said memory device is in an idle state thereof.

13. The method of claim 11 wherein said operation of subsequently coupling comprises subsequently coupling said word line to said first supply voltage source.

14. The method of claim 11 wherein said operation of boosting is carried out by the operation of driving said word line at least a threshold voltage level of said access transistor above said level of the read-state voltage source.

15. The method of claim 11 wherein said operation of additionally boosting is carried out by the operation of driving said word line at least a threshold voltage level of said access transistor above said level of the read-state voltage source.

16. A method for boosting a word line in a random access memory device comprising:

causing a bit line to approach a bit-line precharge voltage to precharge said bit line;

subsequently coupling an associated word line to circuit ground to read a state of a memory cell coupled between said bit line and said word line;

boosting said word line below a level of said circuit ground to restore said state of said memory cell; and additionally boosting said word line below said level of said circuit ground prior to, during, or following, each write operation or group of write operations to said memory cell.

17. The method of claim 16 wherein said operation of coupling is carried out by the operation of maintaining said bit line at a level of said bit-line precharge voltage while said memory device is in an idle state thereof.

18. The method of claim 16 wherein said operation of boosting is carried out by the operation of driving said word line at least a threshold voltage level of an access transistor of said memory cell below said circuit ground.

19. The method of claim 16 wherein said operation of additionally boosting is carried out by the operation of driving said word line at least a threshold voltage level of an access transistor of said memory cell below said circuit ground.

20. A method for boosting a word line in a random access memory device comprising:

coupling a bit line to a precharge voltage source to precharge said bit line;

subsequently coupling an associated word line to a high supply voltage source to read a state of a memory cell coupled between said bit line and said word line;

boosting said word line above a level of said high supply voltage source to restore said state of said memory cell; and additionally boosting said word line above said level of said high supply voltage source prior to, during, or following, each write operation to said memory cell.

21. The method of claim 20 wherein said operation of coupling is carried out by the operation of maintaining said bit line at a level of said precharge voltage source while said memory device is in an idle state thereof.

22. The method of claim 20 wherein said operation of subsequently coupling is carried out by the operation of coupling said word line to said high supply voltage source.

23. The method of claim 20 wherein said operation of boosting is carried out by the operation of driving said word line at least a threshold voltage level of an access transistor of said memory cell above said high supply voltage source.

24. The method of claim 20 wherein said operation of additionally boosting is carried out by the operation of driving said word line at least a threshold voltage level of an access transistor of said memory cell above said high supply voltage source.

\* \* \* \* \*